United States Patent
Mecking et al.

(10) Patent No.: US 6,963,449 B2
(45) Date of Patent: Nov. 8, 2005

(54) METHOD FOR IMPROVING THE IMAGING PROPERTIES OF AT LEAST TWO OPTICAL ELEMENTS AND PHOTOLITHOGRAPHIC FABRICATION METHOD

(75) Inventors: Birgit Mecking, Aalen (DE); Toralf Gruner, Königsbronn (DE); Alexander Kohl, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/709,098

(22) Filed: Apr. 13, 2004

(65) Prior Publication Data
US 2005/0013012 A1 Jan. 20, 2005

Related U.S. Application Data

(63) Continuation of application No. PCT/EP02/11030, filed on Oct. 2, 2002.

(30) Foreign Application Priority Data
Dec. 20, 2001 (DE) .......................................... 101 62 796

(51) Int. Cl.[7] ......................... G02B 27/28; G03B 27/42; G03B 27/72
(52) U.S. Cl. ....................... 359/494; 359/499; 359/900; 355/53; 355/71
(58) Field of Search ............................... 359/483–485, 359/494, 497, 499, 500, 900, 256; 355/53, 71

(56) References Cited

U.S. PATENT DOCUMENTS

| 4,701,606 A | 10/1987 | Tanimoto et al. |
| 5,625,453 A | 4/1997 | Matsumoto et al. |
| 5,677,757 A | 10/1997 | Taniguchi et al. |
| 6,057,970 A | 5/2000 | Kim et al. |
| 6,252,712 B1 | 6/2001 | Furter et al. |

FOREIGN PATENT DOCUMENTS

EP 1 063 684 A1 12/2000

OTHER PUBLICATIONS

Merkel et al., entited "The development of microlithographic high–performance optics," published by International Journal of Optoelectronics, 1989, vol. 4, No. 6, pp. 545–562.

*Primary Examiner*—Georgia Epps
*Assistant Examiner*—Jack Dinh
(74) *Attorney, Agent, or Firm*—Factor & Lake, Ltd.

(57) ABSTRACT

A method for improving imaging properties of two or more optical elements comprises the step of determining for at least one of the two optical elements a polarization-dependent perturbation. In a further step a polarization-independent perturbation is determined for at least one of the two optical elements. Then a target position for the at least one movable optical element is calculated such that, in the target position, the total perturbation of the at least two optical elements which is made up of the polarization-dependent perturbations and polarization-independent perturbations of the two optical elements, is minimized. Finally the at least one movable optical element is moved the to the calculated target position.

10 Claims, 5 Drawing Sheets

METHOD FOR IMPROVING THE IMAGING PROPERTIES OF AT LEAST TWO OPTICAL ELEMENTS AND PHOTOLITHOGRAPHIC FABRICATION METHOD

CROSS-REFERENCE TO RELATED APPLICATIONS

This application is a continuation of and claims priority to International Application PCT/EP02/11030, with an international filing date of Oct. 02, 2002, which claims priority to German patent application No. 101 62 796.3, filed on Dec. 20, 2001, upon which the present application also claims priority, both of which are incorporated herein by reference.

BACKGROUND OF THE INVENTION

1. Field of the Invention

The invention relates to a method for improving the imaging properties of at least two optical elements. More particularly, the invention relates to such a method in which the relative position of the optical elements is mutually adjusted in order to improve the optical imaging. The invention further relates to a photolithographic fabrication method.

2. Description of Related Art

From EP 1 063 684 A1 it is known to determine the birefringence distribution of individual lenses inside a projection lens of a projection exposure system as a polarization-dependent perturbation. The lenses are then selected and arranged inside the projection lens so as to obtain a total birefringence whose magnitude is less than a predetermined limit value for each optical path through the projection lens. The total birefringence is in this case made up of the sum of all the birefringences of the individual lenses being analysed. Such a method is helpful when lenses need to be rejected on the basis of an intolerable birefringence distribution, but in practice does not always lead to specification values being achieved for the imaging properties of the optical elements.

Another optimisation method is known from the specialist article "The development of microlithographic high-performance optics", Int. J. of Optoelec., 1989, 545. When optimising the imaging properties of optical systems having optical elements which are made of crystalline materials, this method provides satisfactory results only if the crystalline materials are specially selected and the optical elements are mounted without stress. Such measures are expensive.

SUMMARY OF THE INVENTION

It is therefore a first object of the present invention to refine an optimisation method of the type mentioned in the introduction, so that a total imaging error made up of the imaging errors of the individual optical components can be further reduced for most practical applications.

This object is achieved by a method comprising the following steps:
a) determining for at least one of the at least two optical elements a polarization-dependent perturbation;
b) determining for at least one of the at least two optical elements a polarization-independent perturbation;
c) calculating a target position for the at least one movable optical element such that, in the target position, the total perturbation of the at least two optical elements which is made up of the polarization-dependent perturbations and polarization-independent perturbations of the at least two optical elements, is minimized;
d) moving the at least one movable optical element to the target position calculated in step c).

The method according to the invention is based on the following facts:

As a rule, polarization-dependent and polarization-independent perturbations contribute to the total perturbation. Polarization-dependent perturbations can be subdivided into: intrinsically present polarization-dependent perturbations, such as the intrinsic birefringence, i.e. that which occurs even in a homogeneous and stress-free material; polarization-dependent perturbations occurring because of external effects, such as stress birefringence; and polarization-dependent perturbations occurring because of material inhomogeneities, such as birefringence due to crystal defects, especially due to the formation of domains in the material.

As a rule, previous determination methods for determining the imaging errors of optical elements have been restricted to polarization-independent perturbations, since it was assumed that conventional optical materials have polarization-dependent perturbations only in exceptional cases. These polarization-dependent perturbations have previously been accommodated without including them in a target-position calculation. This was done, as mentioned above, by material selection or special mounting.

It is known from the Internet publication "Preliminary determination of an intrinsic birefringence in $CaF_2$" by J. H. Burnett, G. L. Shirley and Z. H. Levine, NIST Gaithersburg Md. 20899 USA (posted on 7.5.01), however, that single $CaF_2$ crystals also have non-stress-induced, i.e. intrinsic birefringence. This applies, for example, to ray propagation in the (110) crystal direction. For ray propagation in the (100) crystal direction and in the (111) crystal direction, however, $CaF_2$ does not have any intrinsic birefringence. The birefringence that occurs is therefore dependent on the ray direction. It cannot be eliminated either by material selection or by stress-free mounting of an optical element.

Since $CaF_2$ and other crystalline materials with intrinsic birefringence are being used increasingly as optical materials, particularly in conjunction with UV light sources, the neglect of polarization-dependent perturbations is leading to imaging errors which are not picked up in the known optimisation methods.

Polarization-dependent perturbations cause light rays with orthogonal polarizations to be imaged at different positions. Polarization effects can furthermore cause individual polarization components to experience different imaging errors.

Although the aforementioned EP 1 063 684 A1 takes into account a polarization-dependent perturbation, namely the birefringence, it ignores other perturbations in the scope of optimising the mutual arrangement of the optical components, so that there may some be error contributions to the total imaging error which are avoidable.

According to the invention, both the polarization-dependent perturbations and the polarization-independent perturbations are taken into account in the target-position calculation. In this way, the optical elements can be modelled precisely and fully in respect of their imaging properties.

A polarization-dependent perturbation including stress birefringence takes into account the effect of internal stresses in the optical materials. These internal stresses may, for instance, have been frozen in the material during the production process, or may occur because of the mechanical mounting (frame) of the optical element. Taking the stress birefringence into account improves the optimisation of the imaging properties even for optical elements which do not have any intrinsic stress birefringence.

The at least one optical element, whose polarization-dependent perturbation is determined according in step a), may consist of a crystalline material, and the determination of the polarization-dependent perturbation resulting from stress birefringence may comprise a determination of the position of at least one crystal axis. This can obviate further measurement of polarization-dependent perturbations in the most favourable case, if there are no other polarization-dependent perturbations, since the intrinsic birefringence can be calculated following determination of the crystal axis position.

A degree of freedom in movement which is relatively straightforward to achieve, since it does not involve significant intervention in the mounting of the optical element, is the rotatability of the at least one optical element in step d) about its axis of symmetry.

The effects of displacing a linearly displaceable optical element on the imaging properties of the at least two optical elements allow precise predictions, for example by means of optical design programs, which facilitates calculation of the target position.

Centring errors, in particular, can be compensated if the at least one movable optical element is displaced transversely to an optical axis.

A movable optical element that is tilted relative to an optical axis, for example, allows alignment of the crystal axes of the optical element relative to the optical axis of an overall optical system, which includes the at least two optical elements.

If the polarization-dependent perturbation for the at least one optical element is determined in step a) while this at least one optical element is supported in a frame, this has the effect that the contributions to the stress birefringence from the frame are also taken into account in the determination of the polarization-dependent perturbation. This increases the precision of the optimisation method.

If projection light is used that has a wavelength smaller than 200 nm, many optical materials have polarization-dependent perturbations which affect the imaging properties of optical elements more strongly than, for example, when they are exposed to visible light. The method according to the invention is therefore very effective with exposure to wavelengths of less than 200 nm.

BRIEF DESCRIPTION OF THE DRAWINGS

An exemplary embodiment of the invention will be explained in more detail below with reference to the drawing, in which.

DETAILED DESCRIPTION OF PREFERRED EMBODIMENTS

Figure 1:
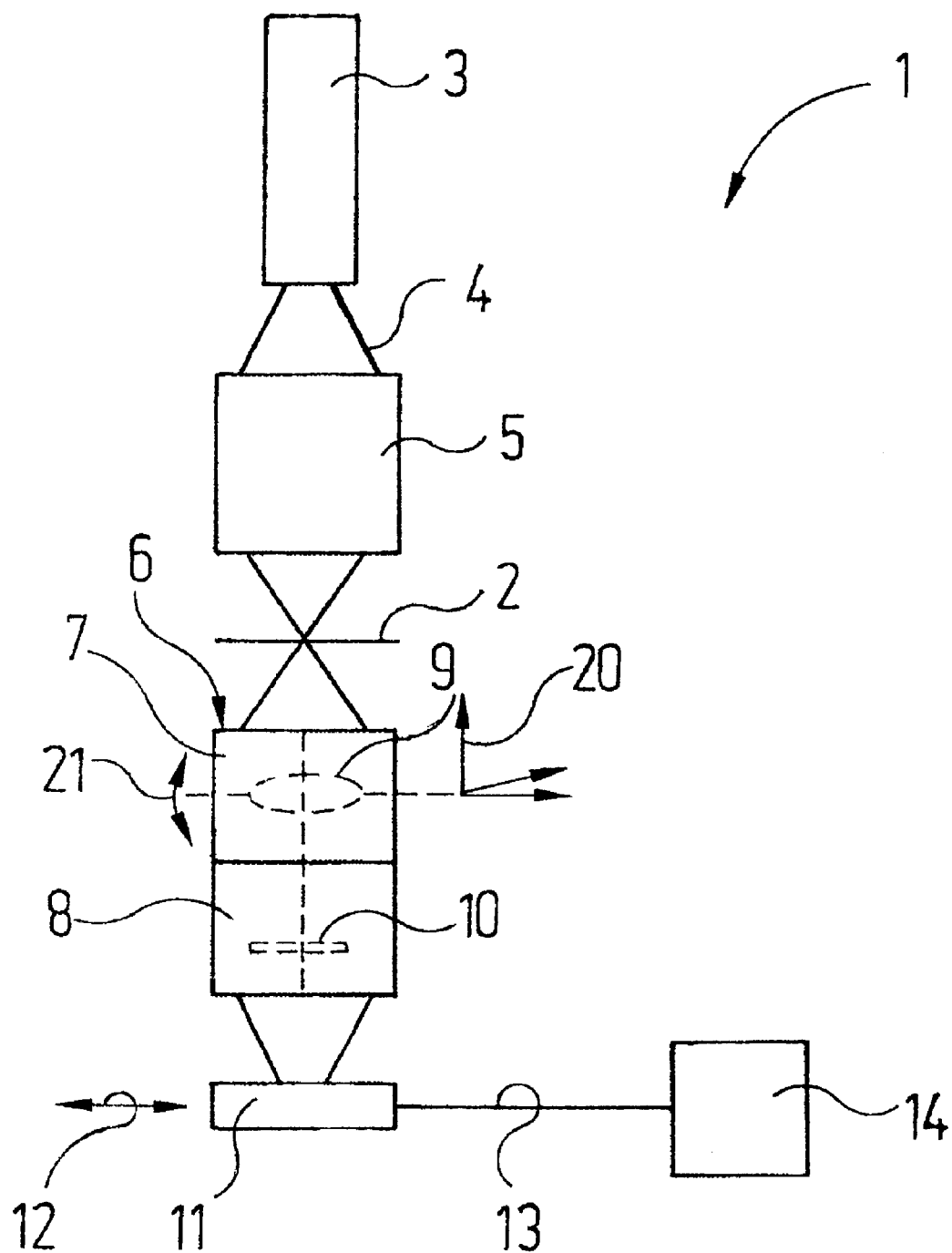
FIG. 1 shows a projection exposure system for microlithography.

A projection exposure system denoted overall by 1 in FIG. 1 is used for transferring a structure from a mask 2 to a wafer (not shown in FIG. 1).

A light source 3, for example an $F_2$ laser with a wavelength of 157 nm, generates a projection light beam 4 for this purpose. It passes first through illumination optics 5 for shaping, and subsequently through the mask 2. A projection lens 6 images the structure present on the mask 2 onto the wafer.

In FIG. 1, the projection lens 6 is divided into a part 7, rotatable about the optical axis of the projection lens 6, and a stationary part 8. In practice, there are often a plurality of rotatable parts in the projection lens 6; restriction to only one rotatable part 7, however, will suffice for the purpose of this description.

In FIG. 1, a biconvex lens 9 is indicated to exemplify the optical components of the rotatable part 7 and a plane-parallel optical plate 10 is indicated to exemplify the optical components of the stationary part 8. Furthermore, as illustrated by a Cartesian coordinate system 20 in FIG. 1, the lens 9 is displaceable both along the optical axis and transversely to the optical axis of the projection lens 6, and it is also tiltable relative to the optical axis of the projection optics 6 as indicated by a double arrow 21 in FIG. 1. The double arrow 21 here denotes one of two possible and mutually perpendicular tilting movements relative to the optical axis. Other optical elements of the projection lens 6, which are not explicitly represented in FIG. 1, may also have the said degrees of freedom in movement.

A position-sensitive sensor 11 is provided in order to analyse perturbations which affect the imaging properties of the projection lens 6. It is displaceable transversely to the optical axis of the projection lens 6, between a measurement position represented in FIG. 1 and a projection exposure position (not shown) withdrawn from the optical path of the projection light beam 4 (cf. double arrow 12 in FIG. 1). The sensor 11 is connected to a computer 14 via a signal line 13.

The lens 9 and the optical plate 10 are made from single crystals of $CaF_2$, which has a cubic crystal symmetry. For production, these optical elements 9, 10 are cut from crystal blocks and polished.

Figure 2:
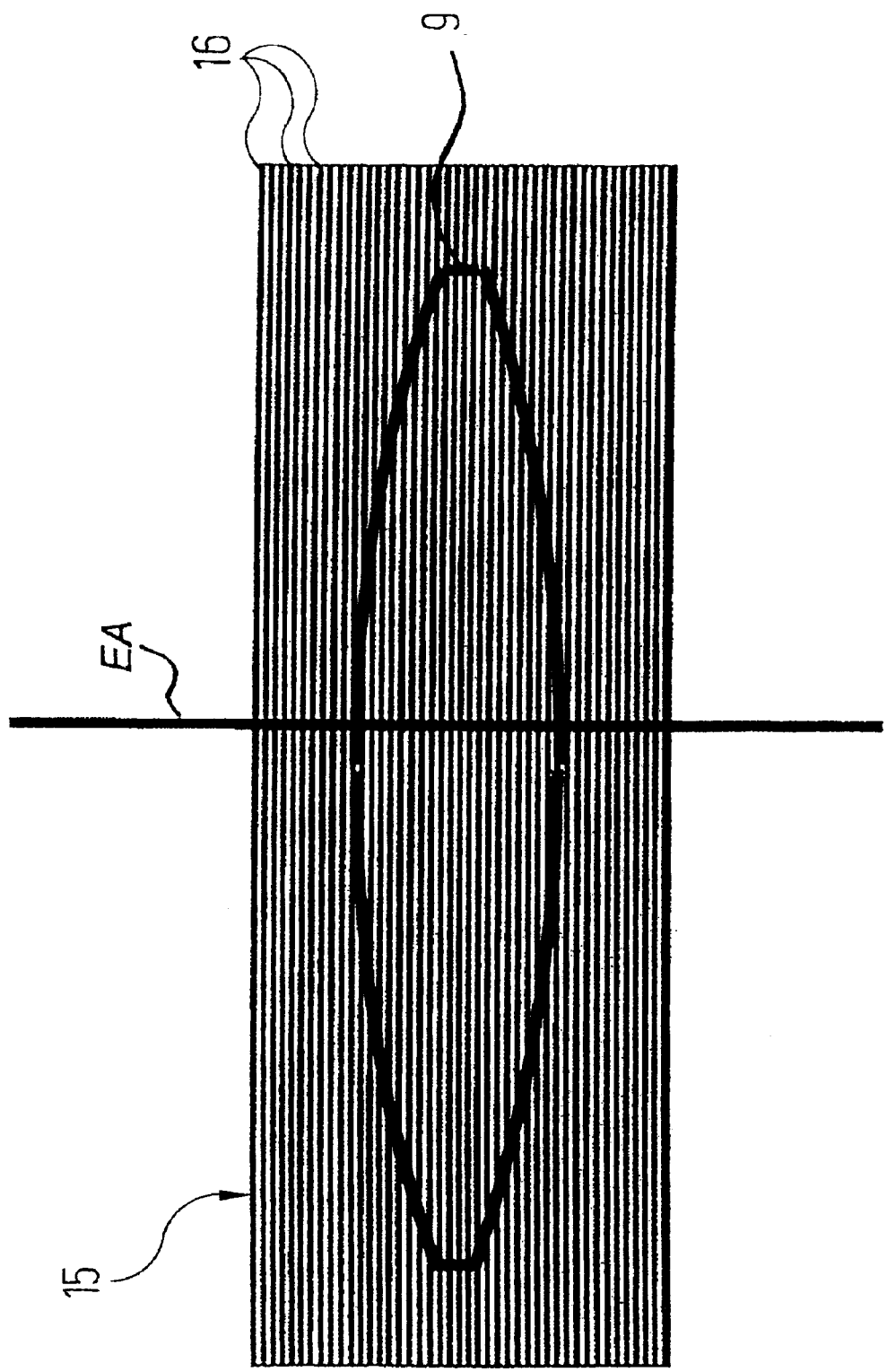
FIG. 2 shows a section through a block of a single crystal as the starting material for a lens of projection lens for the projection exposure system in FIG. 1.

Such a crystal block 15 for the lens 9 is represented by way of example in FIG. 2. It is oriented such that (100) crystal planes 16 are perpendicular to the plane of the drawing, so that their section lines constitute lines extending horizontally with the plane of the drawing. The lens 9 is machined from the crystal block 15 so that its element axis EA, i.e. the optical axis of the lens 9, coincides with the (100) crystal direction, which is perpendicular to the (100) crystal plane.

Figure 3:
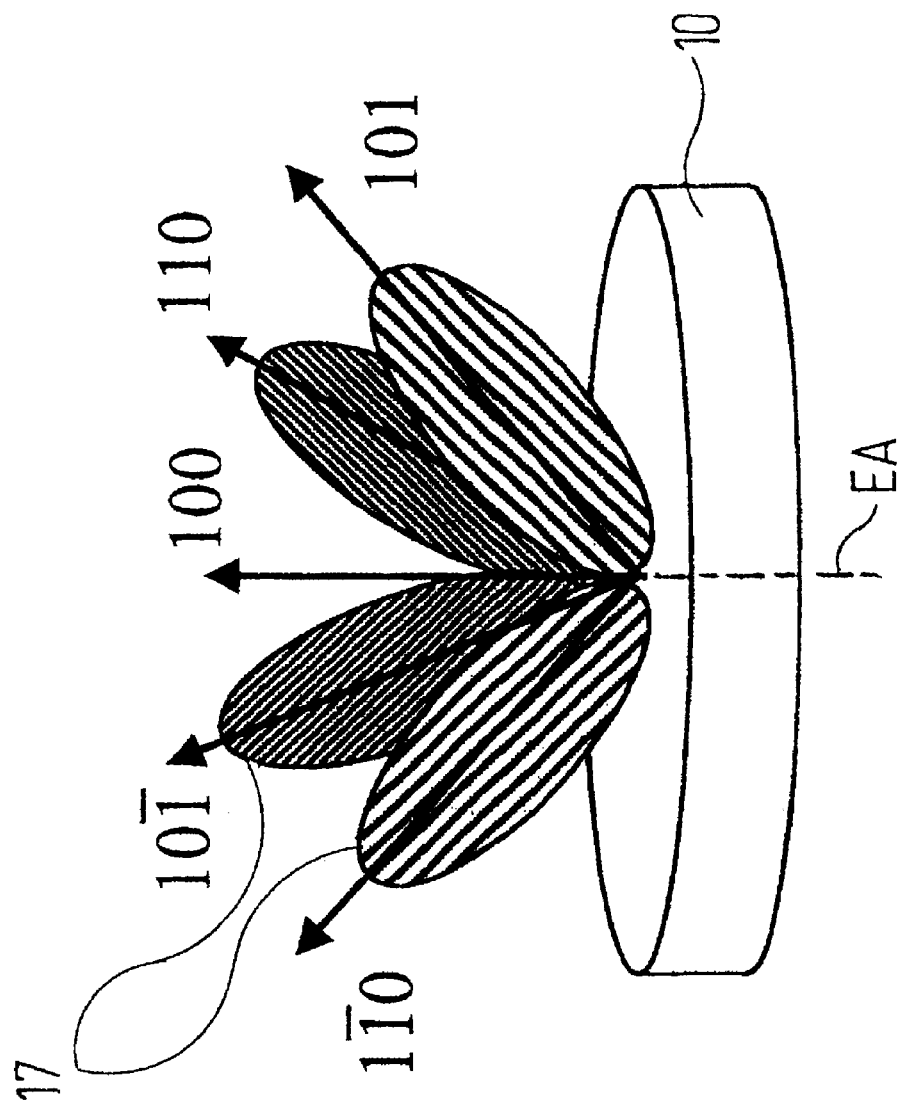
FIG. 3 shows a schematic representation of the intrinsic, birefringence of an optical plate, made from a single crystal, of the projection lens for the projection exposure system in FIG. 1.

The optical plate 10, which is represented separately in FIG. 3, is also machined from a crystal block with such an orientation. Besides the (100) crystal direction, the (101), (110), (10-1) and (1-10) crystal directions are also represented there as arrows, the negative sign when indexing the crystal direction in this description being equivalent to the designation "upper crosswise" in the drawing. An intrinsic birefringence of the optical plate 10 is schematically represented by four "lobes" 17, the areas of which indicate the magnitude of the intrinsic birefringence for the respective ray direction of a light ray of the projection light beam 4 (cf. FIG. 1). The maximum intrinsic birefringence of the optical plate 4 is respectively obtained in the (101), (110), (10-1) and (1-10) crystal directions.

Figure 4:
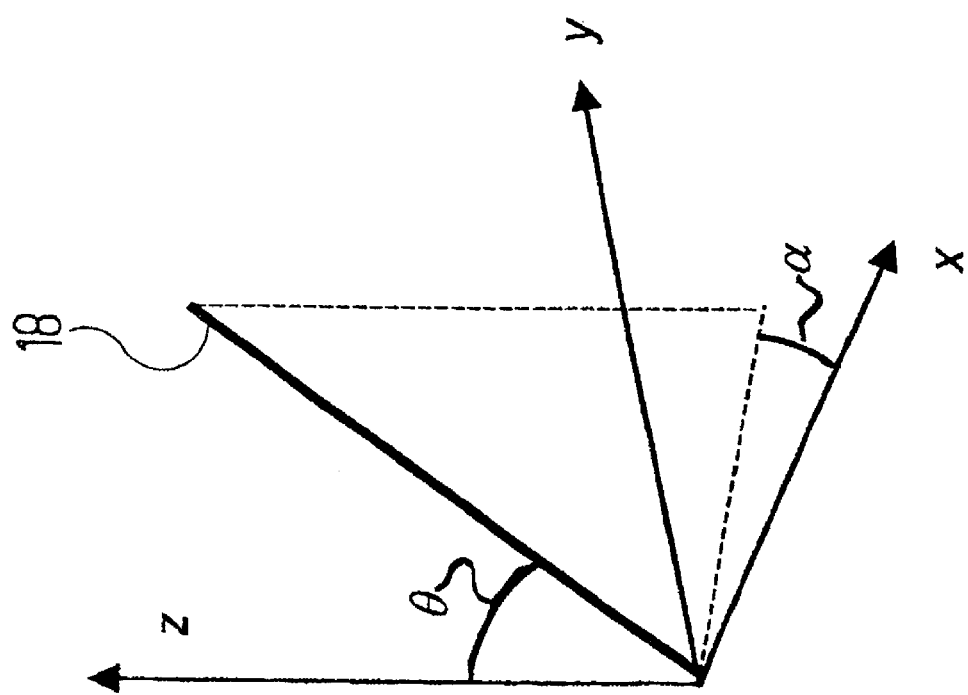
FIG. 4 shows a coordinate system defining an aperture angle and an azimuth angle for rays of a projection light beam of the projection exposure system in FIG. 1.

The ray direction of a light ray 18 of the projection light beam 4 is defined by an aperture angle θ and an azimuth angle α. FIG. 4 illustrates the position of these two angles: a Cartesian coordinate system of the projection exposure system 1 is shown there, the z axis of which coincides with the optical axis of the projection lens 6. The aperture angle θ is the angle between the light ray 18 and the z axis. The azimuth angle α is the angle between the x axis and the projection of the light ray 18 onto the xy plane.

In the following description, the optical components 9, 10 are oriented so that the (100) crystal direction coincides with the z axis and the projection of the (101) crystal direction onto the xy plane coincides with the x axis.

Figure 5:
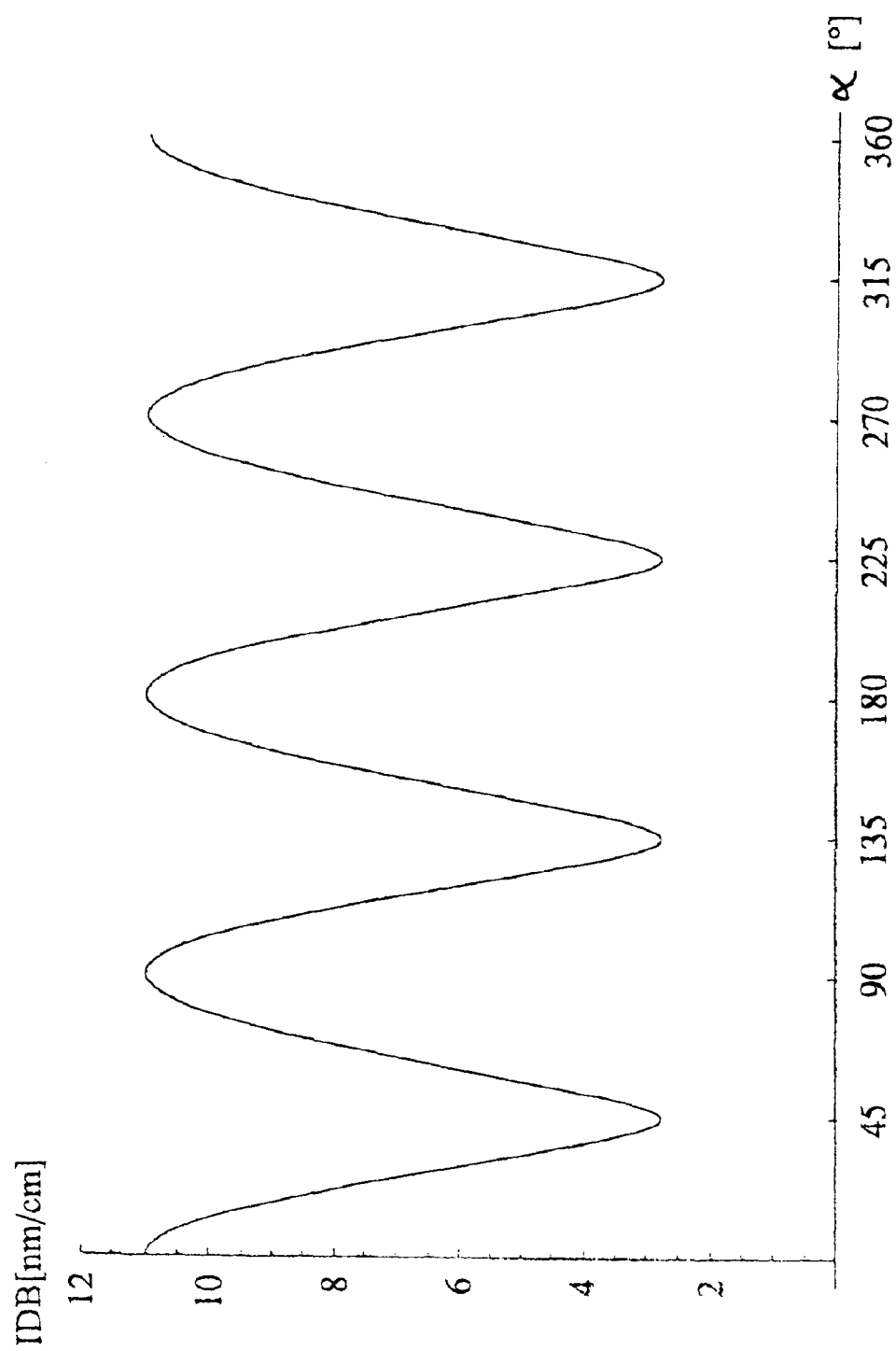
FIG. 5 shows the profile of the intrinsic birefringence of the optical plate in FIG. 3 as a function of the azimuth angle.

FIG. 5 shows the intrinsic birefringence (IDB) of the optical plate 10 as a function of the azimuth angle α for the aperture angle θ=45 degrees. A fourfold symmetry is found, the maxima of the intrinsic birefringence being obtained for light rays whose ray directions coincide with the (101), (110), (10-1) and (1-10) crystal directions (cf. FIG. 3), that is to say for light rays with an aperture angle θ of 45 degrees and an azimuth angle a of 0 degrees, 90 degrees, 180 degrees and 270 degrees. The intrinsic birefringence vanishes (cf. FIG. 3) at an aperture angle of 0 degrees, i.e. a ray direction along the optical axis of the projection lens 6 in the (100) crystal direction.

As the maximum intrinsic birefringence (ray propagation e.g. in the (110) crystal direction, i.e. θ equal to 45 degrees, α equal to 90 degrees), a value of (11.0+/−0.4) nm/cm was measured at a wavelength of 156.1 nm for $CaF_2$.

At the azimuth angles for which intrinsic birefringence occurs (cf. FIG. 5), it decreases continuously with the aperture angle for aperture angles of less than 45 degrees (cf. FIG. 3).

Besides these intrinsic contributions to the birefringence, the lens 9 and the optical plate 10 have additional stress birefringence contributions depending on their installation situation in the projection lens 6, which are added to the intrinsic birefringence. Further birefringence contributions may, for example, be due to crystal defects, in particular the formation of domains. There may even be non-intrinsic birefringence contributions in optical materials which do not have any intrinsic birefringence.

A method for improving the imaging properties of the projection lens 6 is carried out as follows:

First, the optical perturbations of all the optical elements of the projection lens 6 are determined individually. Such measurement methods for determining the aforementioned birefringence contributions as an example of polarization-dependent perturbations, on the one hand, and polarization-independent perturbations, on the other hand, are known to the person skilled in the art. To this end, for example, as indicated by the sensor 11 in FIG. 1, a measurement of the overall imaging properties of the projection lens 6 may be carried out in different adjustment states of the projection lens 6.

As an alternative or in addition, the individual optical elements of the projection lens 6 may be analysed independently of one another with the aid of known measurement methods. In this case, care should be taken to simulate the installation situation of the optical elements in the projection lens 6 as precisely as possible during this independent analysis, so as to prevent the installation of the optical elements in the projection exposure system 1 from giving rise to additional perturbation contributions, which impair the optimisation of the imaging properties of the projection lens 6.

The determination of the birefringence contributions may, for example, comprise determination of the position of the crystal axes of the optical elements to be analysed, when crystalline materials are involved.

The measurement results are evaluated by the computer 14. It determines the respective perturbation contributions of the individual optical elements of the projection lens, and assigns these contributions to the individual polarization-dependent and polarization-independent perturbations. The computer 14 subsequently calculates and optimises a target function (merit function). This target function takes in the dependencies of the perturbation contributions of all the optical elements on the degrees of freedom in movement of these optical elements (rotation, inclination, centring).

In the exemplary embodiment which is represented, this calculation is carried out for the optical components 9 and 10.

As was mentioned above, the lens 9 is rotatable relative to the optical plate 10 about the optical axis. For the lens 9 and the optical plate 10, their respective contributions to the polarization-dependent and polarization-independent perturbations are available after the perturbation contributions have been analysed. Besides the perturbations of the lens 9 and the optical plate 10, the merit function also contains the dependency of the perturbation contributions of the lens 9 on its rotation about the optical axis.

The merit function is subsequently optimised by varying of the degrees of freedom in movement of the mobile parts of the projection lens 6. In the embodiment according to FIG. 1, the merit function is evaluated at each rotation position of the rotatable part 7 of the projection lens 6. The rotation position in which the merit function has the optimum value is subsequently determined.

Finally, the mobile optical elements are brought into the target position which has been determined. In the embodiment according to FIG. 1, the rotatable part 7 with the lens 9 is rotated into the target position which has been determined.

What is claimed is:

1. A method for improving imaging properties of at least two optical elements, at least one of which being a movable optical element, said method comprising the following steps:

a) determining for at least one of the at least two optical elements a polarization-dependent perturbation;

b) determining for at least one of the at least two optical elements a polarization-independent perturbation;

c) calculating a target position for the at least one movable optical element such that, in the target position, the total perturbation of the at least two optical elements which is made up of the polarization-dependent perturbations and polarization-independent perturbations of the at least two optical elements, is minimized;

d) moving the at least one movable optical element to the target position calculated in step c).

2. The method of claim 1, in which the polarization-dependent perturbation includes stress birefringence.

3. The method of claim 2, in which the at least one optical element, whose polarization-dependent perturbation is determined according in step a), consists of a crystalline material, and in which the determination of the polarization-dependent perturbation resulting from stress birefringence comprises a determination of the position of at least one crystal axis.

4. The method of claim 1, in which the at least one movable optical element is rotated in step d) about its axis of symmetry.

5. The method of claim 1, in which the at least one movable optical element is linearly displaced.

6. The method of claim 1, in which the at least one movable optical element is displaced transversely to an optical axis.

7. The method of claim 1, in which the at least one movable optical element is tilted relative to an optical axis.

8. The method of claim 1, in which the polarization-dependent perturbation for the at least one optical element is determined in step a) while this at least one optical element is supported in a frame.

9. A photolithographic method for fabricating semiconductor components by using optical elements whose imaging properties have been improved by the method of claim 1.

10. The photolithographic fabrication method of claim 9, in which projection light is used that has a wavelength smaller than 200 nm.

* * * * *

UNITED STATES PATENT AND TRADEMARK OFFICE
CERTIFICATE OF CORRECTION

PATENT NO.      : 6,963,449 B2
DATED           : November 8, 2005
INVENTOR(S)     : Mecking et al.

It is certified that error appears in the above-identified patent and that said Letters Patent is hereby corrected as shown below:

Title page,
Item [30], Foreign Application Priority Data, German Application No. should read -- 101 62 796.3 --.

Signed and Sealed this

Third Day of January, 2006

JON W. DUDAS
*Director of the United States Patent and Trademark Office*